(12) United States Patent
Noguchi et al.

(10) Patent No.: US 11,133,651 B2
(45) Date of Patent: Sep. 28, 2021

(54) NITRIDE SEMICONDUCTOR LASER DEVICE AND SEMICONDUCTOR LASER APPARATUS

(71) Applicant: SHARP KABUSHIKI KAISHA, Sakai (JP)

(72) Inventors: Akinori Noguchi, Sakai (JP); Yoshihiko Tani, Sakai (JP); Yoshimi Tanimoto, Sakai (JP); Yuhzoh Tsuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 48 days.

(21) Appl. No.: 16/697,041

(22) Filed: Nov. 26, 2019

(65) Prior Publication Data

US 2020/0244041 A1    Jul. 30, 2020

Related U.S. Application Data

(60) Provisional application No. 62/798,392, filed on Jan. 29, 2019.

(51) Int. Cl.
*H01S 5/022* (2021.01)
*H01S 5/22* (2006.01)
*H01S 5/14* (2006.01)
*H01S 5/223* (2006.01)
*H01S 5/042* (2006.01)
*B82Y 20/00* (2011.01)

(52) U.S. Cl.
CPC ........ *H01S 5/2216* (2013.01); *H01S 5/04253* (2019.08); *H01S 5/146* (2013.01); *H01S 5/2231* (2013.01); *B82Y 20/00* (2013.01); *H01S 5/04252* (2019.08)

(58) Field of Classification Search
CPC ...... H01S 5/2216; H01S 5/22; H01S 5/04252; H01S 5/04253; H01S 5/146; H01S 5/02234; H01S 5/2231; B82Y 20/00
See application file for complete search history.

(56) References Cited

U.S. PATENT DOCUMENTS

| 8,379,682 B2 | 2/2013 | Tani et al. |
| 2005/0279994 A1 | 12/2005 | Ueda et al. |
| 2007/0086496 A1* | 4/2007 | Tanaka ................. B82Y 20/00 372/43.01 |
| 2011/0235666 A1 | 9/2011 | Sonobe et al. |

(Continued)

FOREIGN PATENT DOCUMENTS

| JP | 2006-041491 A | 2/2006 |
| JP | 2011-222973 A | 11/2011 |

(Continued)

*Primary Examiner* — Tod T Van Roy

(74) *Attorney, Agent, or Firm* — ScienBiziP, P.C.

(57) ABSTRACT

A nitride semiconductor laser device at least includes a ridge part disposed on a second-conductivity-type semiconductor layer, a conductive oxide layer covering the upper surface of the ridge part and portions of opposite side surfaces of the ridge part, a dielectric layer covering a portion of the conductive oxide layer, and a first metal layer covering the conductive oxide layer and the dielectric layer, wherein a portion of the conductive oxide layer disposed on the upper surface of the ridge part is exposed through the dielectric layer and covered with the first metal layer.

10 Claims, 11 Drawing Sheets

(56) References Cited

U.S. PATENT DOCUMENTS

2012/0213242 A1* 8/2012 Tanaka .................... H01S 5/16
372/50.1
2014/0014998 A1 1/2014 Ohno

FOREIGN PATENT DOCUMENTS

JP 2012-009650 A 1/2012
WO 2013/157176 A1 10/2013

* cited by examiner

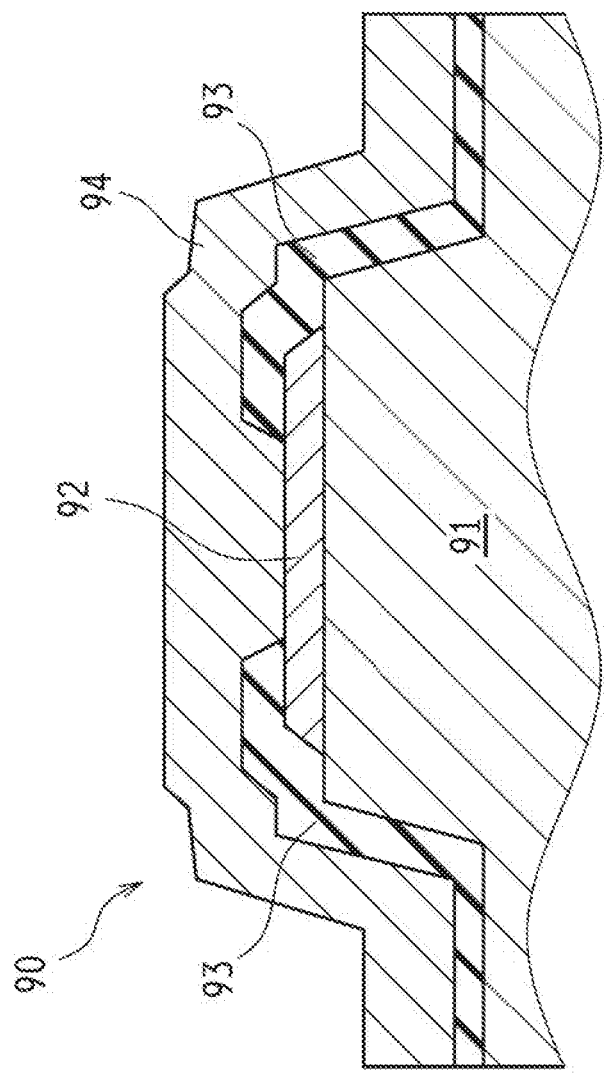

NITRIDE SEMICONDUCTOR LASER DEVICE AND SEMICONDUCTOR LASER APPARATUS

BACKGROUND

1. Field

The present disclosure relates to a nitride semiconductor laser device including, as an electrode material, conductive oxide, and a semiconductor laser apparatus including the nitride semiconductor laser device.

2. Description of the Related Art

Conductive oxide exhibits lower visible light absorbance than metallic electrodes formed of, for example, gold, and has lower refractive index than nitride semiconductors. Thus, it has been proposed that conductive oxide is used to form a layer having both of a function of a conductive electrode and a function of cladding for a laser beam in a nitride semiconductor laser device having a ridge shape.

As such a semiconductor laser device of this type, for example, Japanese Unexamined Patent Application Publication No. 2006-41491 discloses that a blocking layer having a strip opening is disposed on a multilayered body of semiconductor layers, and a conductive oxide layer is formed on the blocking layer to dispose a cladding layer electrode having a ridge-shaped protrusion.

In addition, for example, Japanese Patent No. 5742325 discloses a semiconductor laser device in which a rid e is formed on the upper surface of a p-type nitride semiconductor layer, a conductive oxide layer is formed on the upper surface of the ridge, and a dielectric layer is formed over all the side surfaces of the ridge.

In such an existing configuration, referring to FIG. 11 illustrating a semiconductor laser device 90 as an example, a p-type nitride semiconductor layer 91 is formed so as to have a ridge shape (protrusion). A conductive transparent electrode 92 is formed on the upper surface of the p-type nitride semiconductor layer 91, and a dielectric film 93 is formed from the upper surface to the side surfaces of the p-type nitride semiconductor layer 91. In addition, a metal layer 94 is disposed so as to cover the conductive transparent electrode 92 and the dielectric film 93. However, in such semiconductor laser devices 90, an increase in the operating voltage is observed, and device failures probably caused by the operating voltage often occur, which has been problematic.

It is desirable to provide a highly reliable nitride semiconductor laser device that includes, as an electrode material, conductive oxide, and enables improvements in electrical characteristics such as operating voltage, and a semiconductor laser apparatus including the nitride semiconductor laser device.

SUMMARY (1) According to an aspect of the disclosure, there is provided a nitride semiconductor laser device including a substrate; a first-conductivity-type semiconductor layer formed on the substrate; a light-emitting layer disposed on the first-conductivity-type semiconductor layer; a second-conductivity-type semiconductor layer disposed on the light-emitting layer; a strip ridge part disposed in the second-conductivity-type semiconductor layer; a conductive oxide layer disposed so as to cover an upper surface of the ridge part and portions of opposite side surfaces of the ridge part; a dielectric layer disposed so as to cover a portion of the conductive oxide layer; and a first metal layer disposed so as to cover the conductive oxide layer and the dielectric layer, wherein a portion of the conductive oxide layer disposed on the upper surface of the ridge part has an exposed portion exposed through the dielectric layer, and the exposed portion is covered with the first metal layer.

(2) According to an aspect of the disclosure, there is provided a semiconductor laser apparatus including the nitride semiconductor laser device; and a package sealing the nitride semiconductor laser device.

BRIEF DESCRIPTION OF THE DRAWINGS

FIG. 11 is a partial sectional view illustrating a semiconductor laser device of an existing example.

DESCRIPTION OF THE EMBODIMENTS

Figure 1:
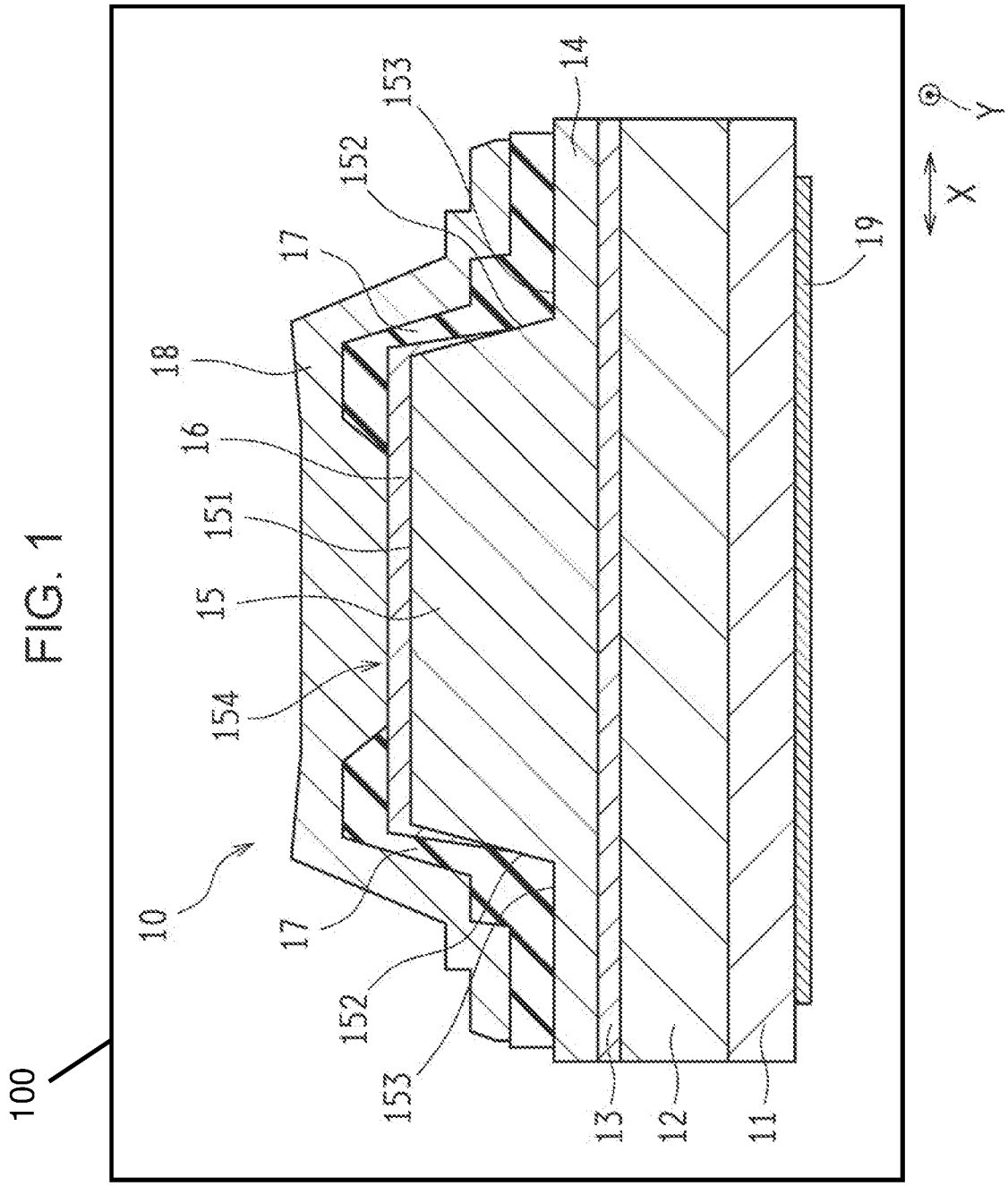
FIG. 1 is a schematic sectional view illustrating a nitride semiconductor laser device according to Embodiment 1 of the present disclosure.

Hereinafter, nitride semiconductor laser devices and a semiconductor laser apparatus according to embodiments of the present disclosure will be described with reference to drawings. Incidentally, in the drawings described below, in order to clarify and simplify the drawings, dimensions such as length, width, and thickness do not reflect actual relations therebetween. In particular, the drawings are drawn with relatively appropriately increased thicknesses. The same reference signs in drawings denote the same portions or corresponding portions.

Embodiment 1

FIG. 1 is a schematic sectional view illustrating a nitride semiconductor laser device 10 according to Embodiment 1 of the present disclosure. As illustrated in the drawing, the nitride semiconductor laser device 10 includes a substrate 11, a first-conductivity-type semiconductor layer 12 formed on the substrate 11, a light-emitting layer 13 disposed on the first-conductivity-type semiconductor layer 12, a secondconductivity-type semiconductor layer 14 disposed on the light-emitting layer 13, a ridge-shaped ridge part 15 disposed in the second-conductivity-type semiconductor layer 14, a conductive oxide layer 16 covering a portion of the ridge part 15, a dielectric layer 17 covering a portion of the conductive oxide layer 16, and a first metal layer 18 covering the conductive oxide layer 16 and the dielectric layer 17. On the back surface of the substrate 11, a first electrode 19 is provided.

Substrate

The substrate 11 may be a nitride semiconductor substrate that is a GaN substrate or an AlGaN substrate. When the AlGaN substrate is used as the substrate 11, it functions as cladding, to suppress leakage of light to the substrate, which occurs in the case of using the GaN substrate. In the case of using the AlGaN substrate, the AlGaN substrate may have an Al content ratio of 7% or less. Regarding the plane orientation of the main plane of the substrate 11, for example, a plane such as a polar plane (0001), a nonpolar plane (1-100), or a semi-polar plane (11-22) may be employed.

First-Conductivity-Type Semiconductor Layer

The first-conductivity-type semiconductor layer 12 may be an AlGaN layer mainly doped with, as the first-conductivity-type impurity, Si, a Si-doped GaN layer, a Si-doped AlInGaN layer, or a Si-doped InGaN layer. Si used for doping the nitride semiconductor functions as an n-type in the nitride semiconductor. The first-conductivity-type semiconductor layer 12 may be constituted by a single layer, or may be constituted by a plurality of layers among the above-described layers.

Light-Emitting Layer

The light-emitting layer 13 is constituted by two or more well layers and one or more barrier layers. More specifically, the light-emitting layer 13 may have well layer/barrier layer/well layer, or may have well layer/barrier layer/well layer/barrier layer/well layer; in each of these cases, well layers are formed as outer layers of the light-emitting layer 13.

In the light-emitting layer 13, such a well layer may be an InGaN layer; and such a barrier layer may be a GaN layer, an InGaN layer, or an AlGaN layer. In the case of employing, as the barrier layer, an InGaN layer, it may be formed so as to have a lower In content ratio than an InGaN layer serving as the well layer. In the case of employing, as the barrier layer, an AlGaN layer, the Al content ratio may be set to 2% or more and 8% or less.

The well layer has a layer thickness of 2.5 nm or more and 7.2 nm or less, preferably 3 nm or more and 4.5 nm or less. In the case of forming a well layer having a lasing wavelength of 450 nm or more, the well layer needs to be formed so as to have a high In content ratio; when such a well layer having a high In content ratio has a layer thickness of more than 5 nm, lattice distortion may cause crystal defects. When the well layer has a layer thickness of less than 2.5 nm, gain may decrease and threshold current density may increase, which is disadvantageous. The barrier layer may have a layer thickness of 2.8 nm or more and 6 nm or less.

In the case of forming four or more well layers having a lasing wavelength of 450 nm or more, lattice distortion may cause serious crystal defects, resulting in degradation of laser characteristics. For this reason, the light-emitting layer 13 may have 2 or more and 3 or less well layers.

Second-Conductivity-Type Semiconductor Layer

The second-conductivity-type semiconductor layer 14 may be an AlGaN layer doped with Mg as an impurity, a Mg-doped GaN layer, a Mg-doped AlInGaN layer, or a Mg-doped InGaN layer. Mg used for doping the nitride semiconductor functions as a p-type in the nitride semiconductor. The second-conductivity-type semiconductor layer 14 may be constituted by a single layer, or may be constituted by a plurality of layers among the above-described layers.

For example, when the second-conductivity-type semiconductor layer 14 is constituted by three layers, on the light-emitting layer 13, a first p-type semiconductor layer, a second p-type semiconductor layer, and a third p-type semiconductor layer may be formed in this order to form the second-conductivity-type semiconductor layer 14.

The first p-type semiconductor layer may be formed as a Mg-containing $Al_xGa_{1-x}N$ ($0 \leq x \leq 0.35$) layer that has a layer thickness of 15 nm or less and functions as a blocking layer for electron carriers.

The second p-type semiconductor layer may be formed as a Mg-containing $Al_xGa_{1-x}N$ ($0 \leq x \leq 0.055$) layer that functions as a cladding layer. The layer thickness of the second p-type semiconductor layer is not particularly limited, but is desirably 350 nm or less. A decrease in the layer thickness of the second p-type semiconductor layer achieves a decrease in the operating voltage. For this reason, the layer thickness is more preferably 280 nm or less.

The third p-type semiconductor layer may be formed as a Mg-containing $In_xAl_yGa_{1-x-y}N$ ($0 \leq x \leq 0.015$, $0 \leq y \leq 0.1$) layer that functions as a contact layer in contact with the conductive oxide layer 16. The layer thickness of the third p-type semiconductor layer is not particularly limited, but is desirably 20 nm or less. A decrease in the layer thickness of the third p-type semiconductor layer achieves a decrease in the operating voltage. For this reason, the layer thickness is more preferably 10 nm or less.

The second-conductivity-type semiconductor layer 14 partially includes the ridge part 15 formed so as to have a ridge shape. The ridge part 15 is formed so as to have a strip shape (elongated shape) extending in a direction (the Y direction in FIG. 1) orthogonal to the edge surfaces of the nitride semiconductor laser device 10.

Conductive Oxide Layer

On the ridge part 15, the conductive oxide layer 16 is formed. In the configuration illustrated in FIG. 1, the conductive oxide layer 16 is formed with a strip shape so as to cover the whole upper surface (top surface) of the ridge part 15, and to cover partially surfaces (opposite to each other in the X direction) of the ridge part 15.

Incidentally, in the following description, a surface positioned at the top portion of the ridge part 15 is referred to as an upper surface 151 of the ridge part 15; when the X direction in FIG. 1 is defined as the left-right direction, the left-right opposite surfaces of the ridge part 15 (inclined surfaces opposite to each other in the X direction) are referred to as side surfaces 152 of the ridge part 15; and the upper surfaces of the second-conductivity-type semiconductor layer 14 positioned on lower-end opposite sides of the ridge part 15 (left-right opposite sides of the ridge part 15) are referred to as bottom surfaces 153 of the ridge part 15.

Half or more (from the upper surface 151) of the region of each side surface 152 of the ridge part 15 may be covered with the conductive oxide layer 16. For example, when the second-conductivity-type semiconductor layer 14 is constituted by three layers that are the first p-type semiconductor layer, the second p-type semiconductor layer, and the third p-type semiconductor layer, the conductive oxide layer 16 formed on the upper surface of the ridge part 15 is disposed in contact with the third p-type semiconductor layer. The conductive oxide layer 16 formed on the opposite side surfaces of the ridge part 15 may be disposed in contact with the side surfaces 152 of the ridge part 15 in the third p-type semiconductor layer and the side surfaces 152 of the ridge part 15 in the second p-type semiconductor layer.

This configuration achieves an increase in the coverage ratio of covering the side surfaces 152 of the ridge part 15 with the conductive oxide layer 16. Such an increase in the coverage ratio of the ridge part 15 covered with the conductive oxide layer 16 effectively prevents hydrogen generated from the dielectric layer 17 from permeating into the second-conductivity-type semiconductor layer 14.

Incidentally, the second-conductivity-type semiconductor layer 14 may further include a plurality of layers between the second p-type semiconductor layer and the third p-type semiconductor layer. When the conductive oxide layer 16 is formed so as to extend to the bottom surfaces 153 on the opposite sides of the ridge part 15 (refer to Embodiment 2 described later), the conductive oxide layer 16 may be disposed in contact with the second p-type semiconductor layer exposed during formation of the ridge part 15.

The conductive oxide layer 16 may be formed of, for example, indium tin oxide (ITO), indium zinc oxide (IZO), zinc oxide (ZnO), or gallium oxide ($GaO_3$). The conductive oxide layer 16 may be formed with a layer thickness of 50 nm or more and 500 nm or less.

Dielectric Layer

The conductive oxide layer 16 is partially covered with the dielectric layer 17 that confines current. The dielectric layer 17 ensures insulation between the upper surfaces of the second-conductivity-type semiconductor layer 14, which are the bottom surface regions of the ridge part 15, and the side surfaces 152 of the ridge part 15, and also ensures a refractive index difference relative to the second-conductivity-type semiconductor layer 14.

In the configuration illustrated in FIG. 1, the dielectric layer 17 is formed on the second-conductivity-type semiconductor layer 14 so as to cover left and right opposite side surfaces 152 of the ridge part 15 and portions of the upper surface 151 of toe ridge part 15.

Thus, the opposite side surfaces 152 of the ridge part 15 are covered with the conductive oxide layer 16 and the dielectric layer 17. The dielectric layer 17 is disposed also on sides (opposite to each other in the X direction) of the ridge part 15. The portion of the conductive oxide layer 16 covering the upper surface 151 of the ridge part 15 (the portion being positioned at the upper surface 151 of the ridge part 15) includes portions covered with the dielectric layer 17 and an exposed portion 154 exposed through the dielectric layer 17.

In the upper surface 151 of the ridge part 15, edge portions opposite to each other in the X direction are covered with the dielectric layer 17, and the exposed portion 154 in the central portion is exposed through the dielectric layer 17. The exposed portion 154 is formed with a width narrower than the width (in the X direction) of the upper surface 151 of the ridge part 15, and is disposed so as to extend in the Y direction.

The dielectric layer 17 may be formed of, for example, silicon oxide, aluminum oxide ($Al_2O_3$), titanium oxide ($TiO_2$), tantalum oxide ($Ta_2O_5$), or zirconium oxide ($ZrO_2$). The dielectric layer 17 may be formed with a layer thickness of 100 nm or more and 500 nm or less.

First Metal Layer

The exposed portion 154 of the conductive oxide layer 16 is covered with the first metal layer 18. The first metal layer 18 is formed so as to cover the exposed portion 154 of the conductive oxide layer 16 exposed through the dielectric layer 17, and the dielectric layer 17.

The first metal layer 18 may be formed of, for example, titanium, nickel, gold, palladium, platinum, molybdenum, or aluminum. The first metal layer 18 is not limited to a single layer, and may be constituted by a plurality of metal layers.

The inventors of the present disclosure performed studies and, as a result, have found the following findings: the above-described increase in the operating voltage of the semiconductor laser device particularly occurs in a nitride semiconductor laser device having a ridge-strip-type current confinement structure containing conductive oxide where a dielectric layer for blocking current is disposed in contact with all the side surfaces of the ridge part of the second-conductivity-type semiconductor layer, so that the semiconductor laser device cannot sufficiently exert its performance.

This is inferentially caused in the following manner: a heat treatment performed after formation of the dielectric film in order to lower the contact resistance between layers that are the second-conductivity-type semiconductor layer, the conductive oxide layer, and the first metal layer, turns hydrogen or water adsorbed on the dielectric layer, into desorbed or decomposed hydrogen; the hydrogen permeates into the second-conductivity-type semiconductor layer, to bond to Mg contained in the second-conductivity-type nitride semiconductor layer, to deactivate Mg.

In general, as the dopant for the second-conductivity-type semiconductor layer, Mg is used; however, when a hydrogen atom bonds to Mg, change into the p-type is known to be inhibited, which results in an increase in the operating voltage.

In the nitride semiconductor laser device 10 according to this embodiment, a region into which current is substantially injected. (current confinement region) is the ridge part 15 of the second-conductivity-type semiconductor layer 14. Thus, hydrogen generated from the dielectric layer 17 is prevented from permeating into the ridge part 15 of the second-conductivity-type semiconductor layer 14, to thereby suppress the increase in the voltage due to current injection failure.

In the nitride semiconductor laser device 10 according to this embodiment, the conductive oxide layer 16, which is a film impermeable to hydrogen atoms, is formed so as to cover at least the upper surface 151 and portions of the side surfaces 152 of the ridge part 15 of the second-conductivity-type semiconductor layer 14. This prevents hydrogen generated from the dielectric layer 17 from permeating into a region near the upper surface 151 of the ridge part 15 of the second-conductivity-type semiconductor layer 14. This prevents the deterioration in the operating voltage in the nitride semiconductor laser device 10, to thereby improve the electrical characteristics.

As described above, the conductive oxide layer 16 may be disposed so as to cover half or more of the side surfaces 152 of the ridge part 15. This achieves an increased coverage ratio of the conductive oxide layer 16 covering the side surfaces 152 of the ridge part 15, to suppress permeation of hydrogen generated from the dielectric layer 17 into the second-conductivity-type semiconductor layer 14.

Figure 2:
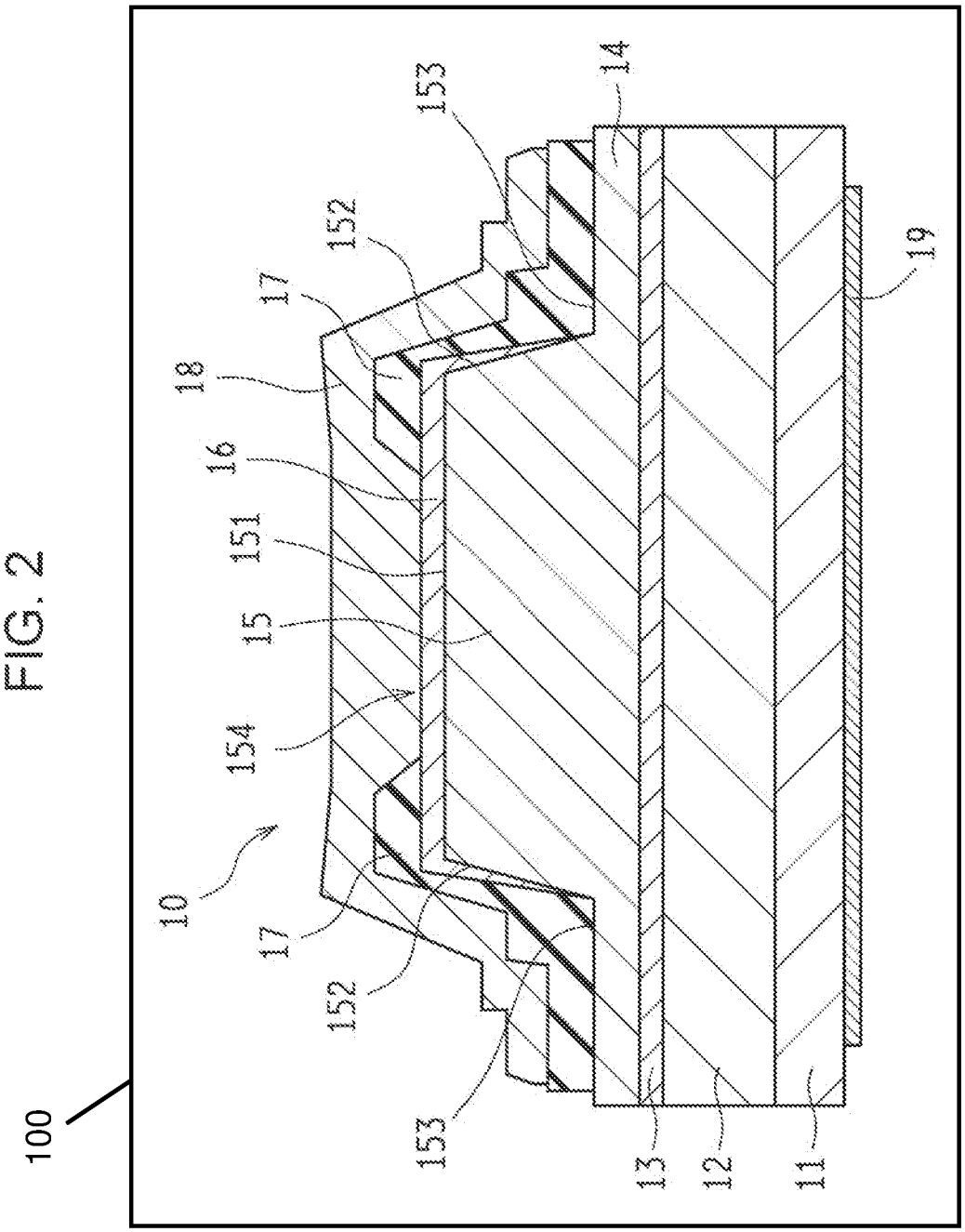
FIG. 2 is a schematic sectional view illustrating another example of the nitride semiconductor laser device according to Embodiment 1 of the present disclosure.

FIG. 2 is a schematic sectional view illustrating another example of the nitride semiconductor laser device 10 according to Embodiment 1 of the present disclosure. As illustrated in the drawing, in the nitride semiconductor laser device 10, the conductive oxide layer 16 may be formed so as to cover the upper surface 151 of the ridge part 15 and all the opposite side surfaces 152 of the ridge part 15.

In this case, the side surfaces 152 of the ridge part 15 are completely covered with the conductive oxide layer 16. This further suppresses permeation of hydrogen generated from the dielectric layer 17 into the second-conductivity-type semiconductor layer 14.

Embodiment 2

Figure 3:
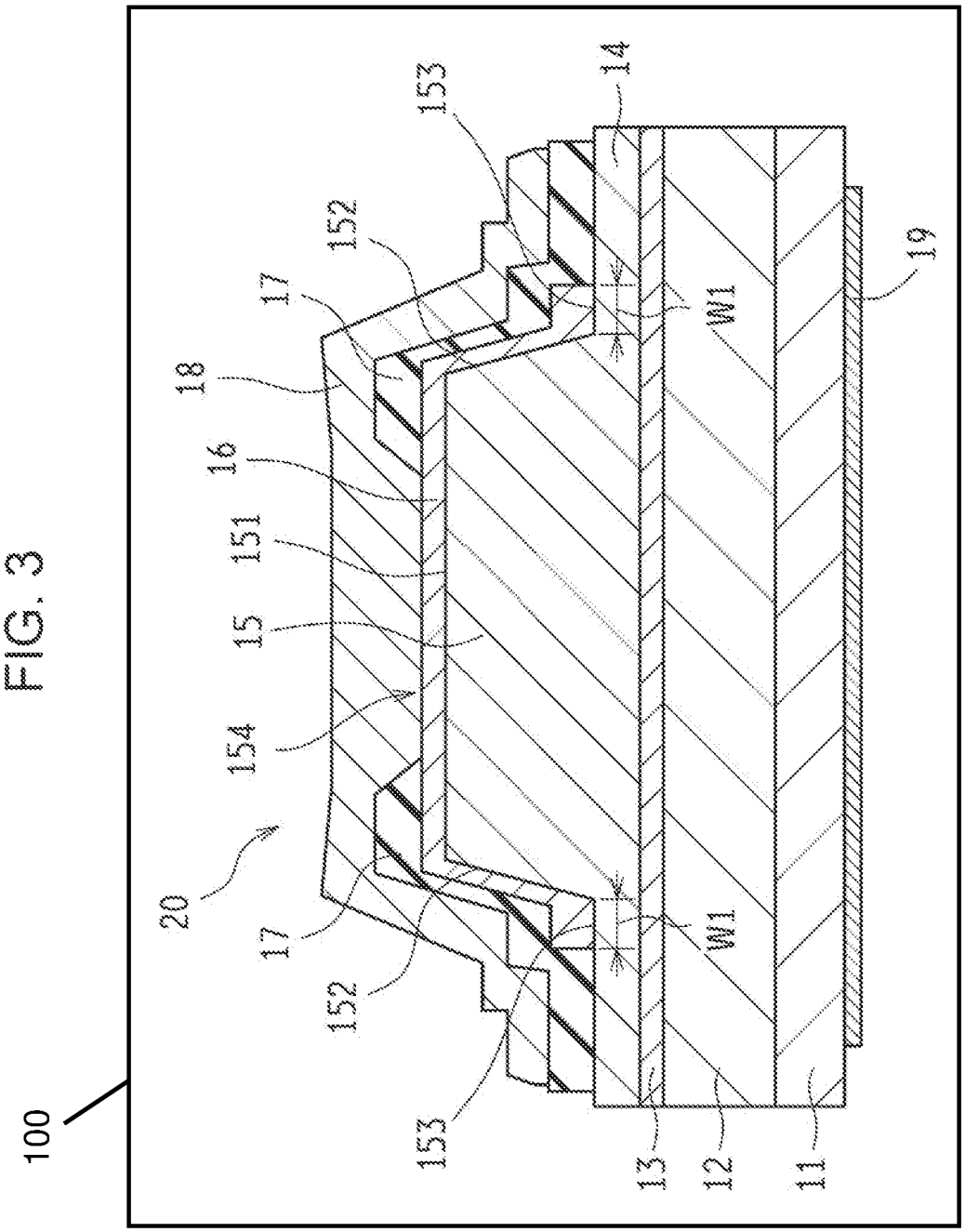
FIG. 3 is a schematic sectional view illustrating a nitride semiconductor laser device according to Embodiment 2 of the present disclosure.
Figure 4:
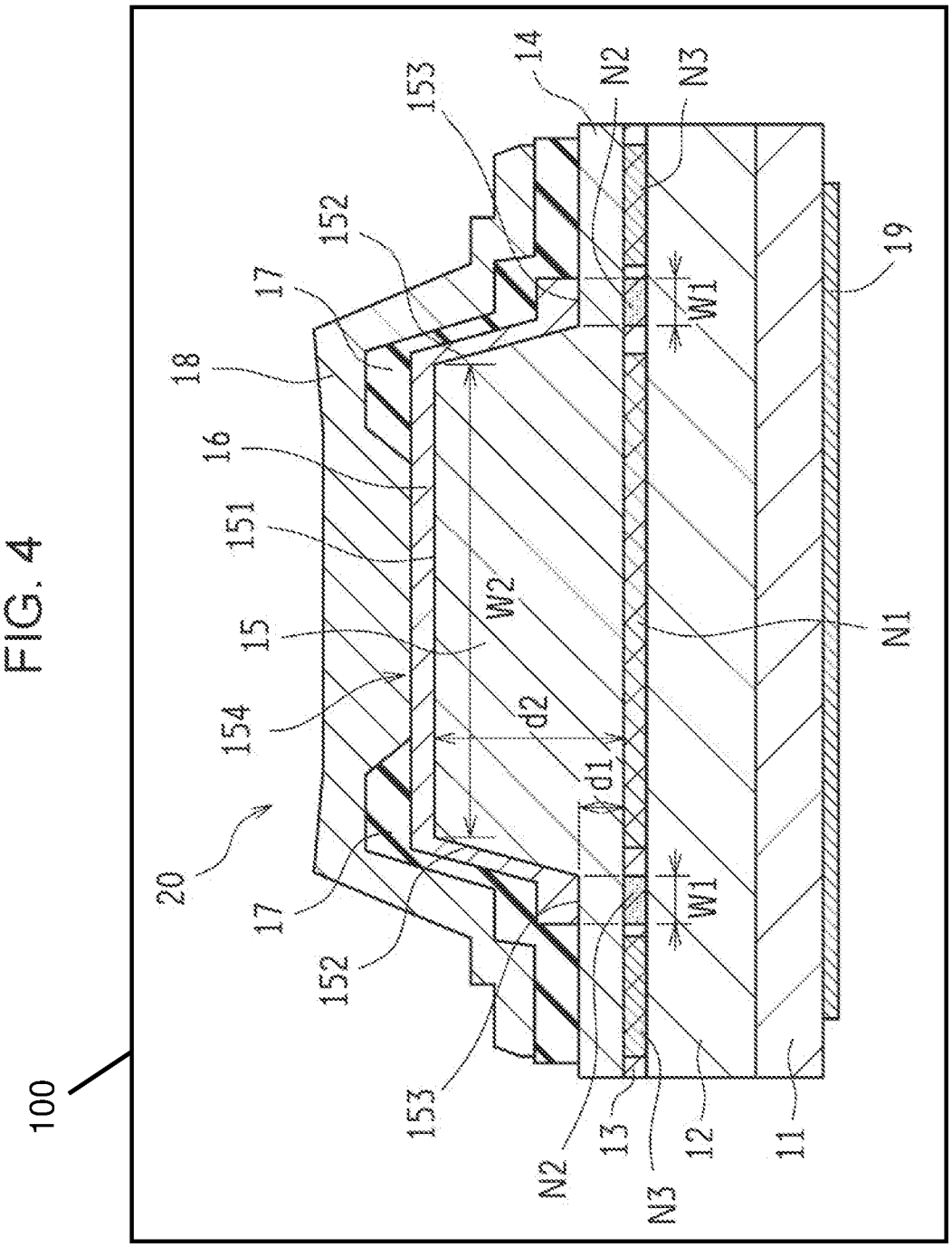
FIG. 4 is a schematic sectional view for explaining the nitride semiconductor laser device of FIG. 3.
Figure 5:
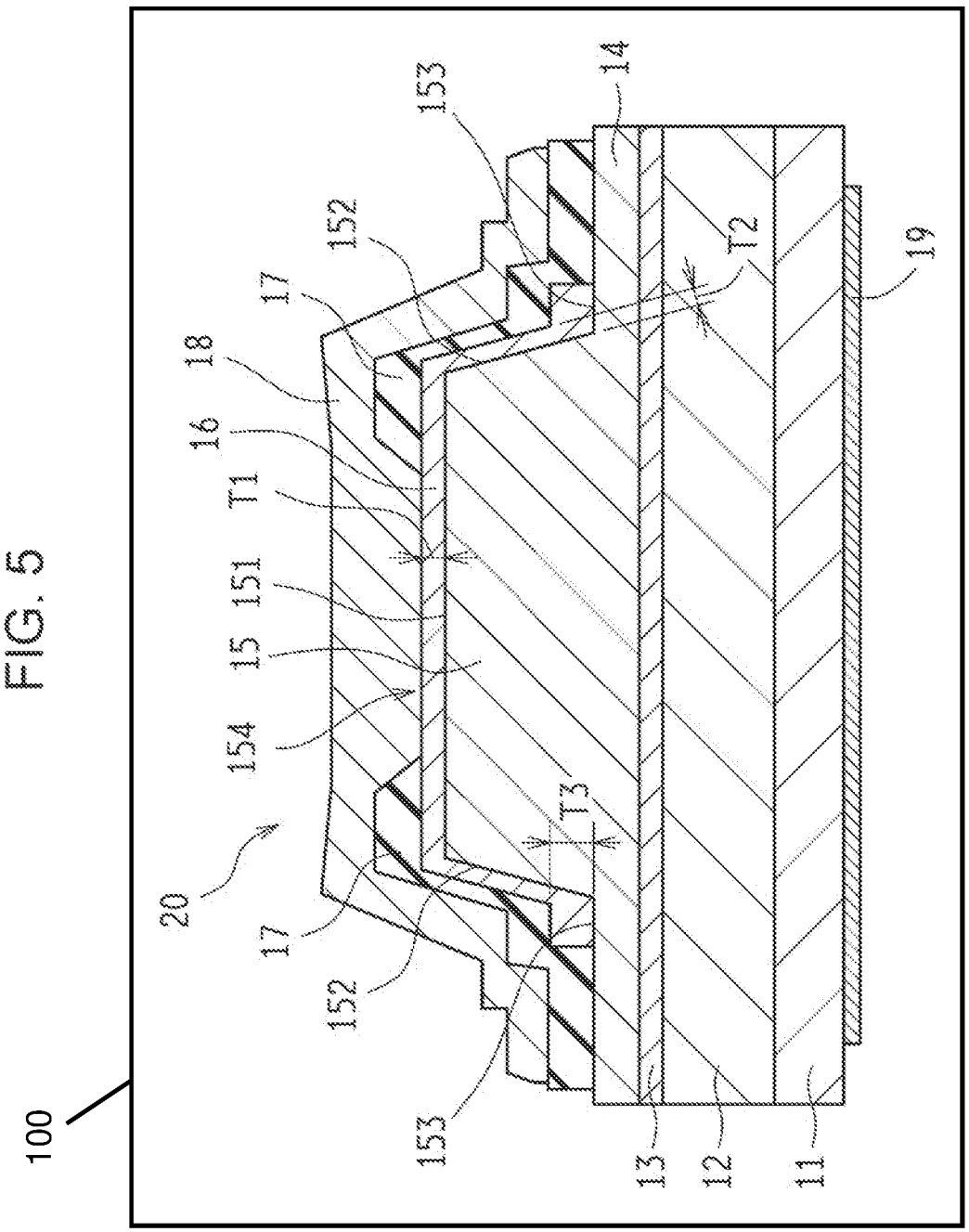
FIG. 5 is a schematic sectional view for further explaining the nitride semiconductor laser device of FIG. 3.

FIG. 3 to FIG. 5 are schematic sectional views illustrating a nitride semiconductor laser device 20 according to Embodiment 2 of the present disclosure. The nitride semiconductor laser device 20 according to Embodiment 2 is characterized by the form of the conductive oxide layer 16, but the other basic elements are the same as in the nitride semiconductor laser device 10 described in Embodiment 1. For this reason, the conductive oxide layer 16 different from Embodiment 1 will be described in detail, but the other elements will be denoted by the same reference signs as in Embodiment 1 and will not be described.

As illustrated in FIG. 3, in the nitride semiconductor laser device 20, the conductive oxide layer 16 is disposed so as to cover the upper surface 151 of the ridge part 15, the opposite side surfaces 152 of the ridge part 15, and portions of the bottom surfaces 153 of the ridge part 15 (the upper surfaces of the second-conductivity-type semiconductor layer 14). The conductive oxide layer 16 is continuously disposed from the upper surface 151 to the bottom surfaces 153 of the ridge part 15.

In general, the ridge-type semiconductor laser device is designed such that current is injected from the upper surface of the ridge part, and light is concentrated in the active layer immediately below the protruding ridge shape. This is because this design enables efficient combination of current and light, which results in improvements in the laser characteristics. Thus, current flowing out into regions other than the light concentration region causes loss, which results in a decrease in the power efficiency.

By contrast, in the nitride semiconductor laser device 20 according to this embodiment illustrated in FIG. 3, the conductive oxide layer 16 is formed on the side surfaces 152 of the ridge part 15 and the bottom surfaces 153 of the ridge part 15; in general, current flowing through the conductive oxide layer 16 tends to flow in the vertical direction (that is the upright direction in the drawing and is the layer stacking direction perpendicular to the main surface of the substrate 11) relative to the horizontal direction (lateral direction), so that a low proportion of current leaks into regions (the conductive oxide layer 16 extending over the bottom surfaces 153 on opposite sides of the ridge part 15) other than the light concentration region. Rather, the configuration in which the side surfaces 152 of the ridge part 15 are completely covered with the conductive oxide layer 16 almost prevents hydrogen generated from the dielectric layer 17 from permeating into the second-conductivity-type semiconductor layer 14. This prevents, in the nitride semiconductor laser device 20, the deterioration in the operating voltage, to thereby further improve the electrical characteristics.

For example, as illustrated in FIG. 3, the conductive oxide layer 16 is disposed so as to cover portions of the bottom surfaces 153 on opposite sides of the ridge part 15; the conductive oxide layer 16 may have a width W1 of 1.5 μm or less. This reduces the effect of leakage current on the conductive oxide layer 16 extending over the bottom surfaces 153 on opposite sides of the ridge part 15, to thereby prevent the decrease in the power efficiency.

The conductive oxide layer 16 has a refractive index higher than the refractive index of the dielectric layer 17. As illustrated in FIG. 4, the conductive oxide layer 16 extending over the bottom surfaces 153 on opposite sides of the ridge part 15 may have a width W1 that is ⅕ or less of a width (strip width) W2 of the upper surface 151 of the ridge part 15.

The conductive oxide layer 16 formed of, for example, ITO and the dielectric layer 17 formed of, for example, $SiO_2$ have lower refractive indexes than the second-conductivity-type semiconductor layer 14. Thus, the refractive indexes of the conductive oxide layer 16, the dielectric layer 17, and the second-conductivity-type semiconductor layer 14 satisfy the following relation:

Second-conductivity-type semiconductor layer 14>Conductive oxide layer 16>Dielectric layer 17

The distance d1 between the conductive oxide layer 16 formed on the bottom surfaces 153 on opposite sides of the ridge part 15, and the light-emitting layer 13 positioned under the dielectric layer 17 is shorter than the distance d2 between the conductive oxide layer 16 formed on the upper surface 151 of the ridge part 15, and the light-emitting layer 13 positioned under the dielectric layer 17.

The nitride semiconductor laser device 20 has the above-described configuration, so that the refractive index within the light-emitting layer 13 decreases in a direction perpendicular to the ridge part 15. Specifically, as illustrated in FIG. 4, in the light-emitting layer 13 of the nitride semiconductor laser device 20, when a light-emitting layer region immediately below the ridge part 15 is defined as N1, a light-emitting layer region immediately below the conductive oxide layer 16 extending over the bottom surfaces 153 on opposite sides of the ridge part 15 is defined as N2, and a light-emitting layer region immediately below the dielectric layer 17 formed on the bottom surfaces 153 on opposite sides of the ridge part 15 is defined as N3, the refractive indexes of the light-emitting layer regions N1, N2, and N3 satisfy the following relation:

Light-emitting layer region N1>Light-emitting layer region N2>Light-emitting layer region N3.

Thus, in the nitride semiconductor laser device 20 according to this embodiment, the laser beam propagating within the light-emitting layer 13 concentrates in high refractive index regions, so that the light-emitting layer region N1 and the two light-emitting layer regions N2 contribute, to thereby achieve an increase in the width of the laser beam propagating within the light-emitting layer 13. This increase is significant, compared with existing ridge-type semiconductor laser devices not including the conductive oxide layer on the bottom surfaces of the ridge part.

In addition, in existing ridge-type semiconductor lasers, in order to increase the width of the laser beam propagating through the light-emitting layer or to prevent optical damage (Catastrophic Optical Damage: COD), the width (W2) of the upper surface of the ridge part needs to be increased. This causes an increase in the operating current, to cause an increase in the power consumption, which has been problematic.

By contrast, in the nitride semiconductor laser device 20 according to this embodiment, without changing the width W2 of the upper surface of the ridge part 15, the width of the laser beam emitted from the light-emitting layer 13 can be changed on the basis of the width W1 of the conductive oxide layer 16. The width W1 of the conductive oxide layer 16 may be ⅕ or less of the width W2 of the upper surface of the ridge part 15; when the width W1 is larger than this range, the threshold current increases.

As illustrated in FIG. 5, in the conductive oxide layer 16 of the nitride semiconductor laser device 20, when the layer thickness of the conductive oxide layer 16 formed on the upper surface 151 of the ridge part 15 is defined as T1, the layer thickness of the conductive oxide layer 16 formed on the side surfaces 152 of the ridge part 15 is defined as T2, and the layer thickness of the conductive oxide layer 16 formed over the bottom surfaces 153 on opposite sides of the ridge part 15 is defined as T3, these layer thicknesses T1, T2, and T3 satisfy the following relation:

T1>T2 or T1>T3.

This causes an increase in the electric resistance against current flowing (in the horizontal direction) in the conductive oxide layer 16, to thereby further suppress leakage of current to the conductive oxide layer 16 extending over the bottom surfaces 153 on opposite sides of the ridge part 15.

The conductive oxide layer 16 on the upper surface 151 of the ridge part 15 is formed so as to have a layer thickness T1 larger than the other layer thicknesses (T2 and T3), for example, in the following manner: for example, a sputtering apparatus is used to form the conductive oxide layer 16 on the upper surface, the side surfaces, and the bottom surfaces of the ridge part 15, and subsequently a photoresist technique is used to form again the conductive oxide layer 16 only on the upper surface of the ridge part 15.

Also in the nitride semiconductor laser device 20 according to Embodiment 2, the conductive oxide layer 16, which is a film impermeable to hydrogen atoms, is disposed so as to cover the upper surface 151, the side surfaces 152, and portions of the bottom surfaces 153 of the ridge part 15, to thereby prevent hydrogen generated from the dielectric layer 17 from permeating into a region near the upper surface 151 of the ridge part 15 of the second-conductivity-type semiconductor layer 14. In addition, leakage of current to the conductive oxide layer 16 extending over the bottom surfaces 153 on opposite sides of the ridge part 15 can be further suppressed. Thus, the deterioration in the operating voltage in the nitride semiconductor laser device 20 is prevented, to improve the electrical characteristics.

Embodiment 3

Figure 6:
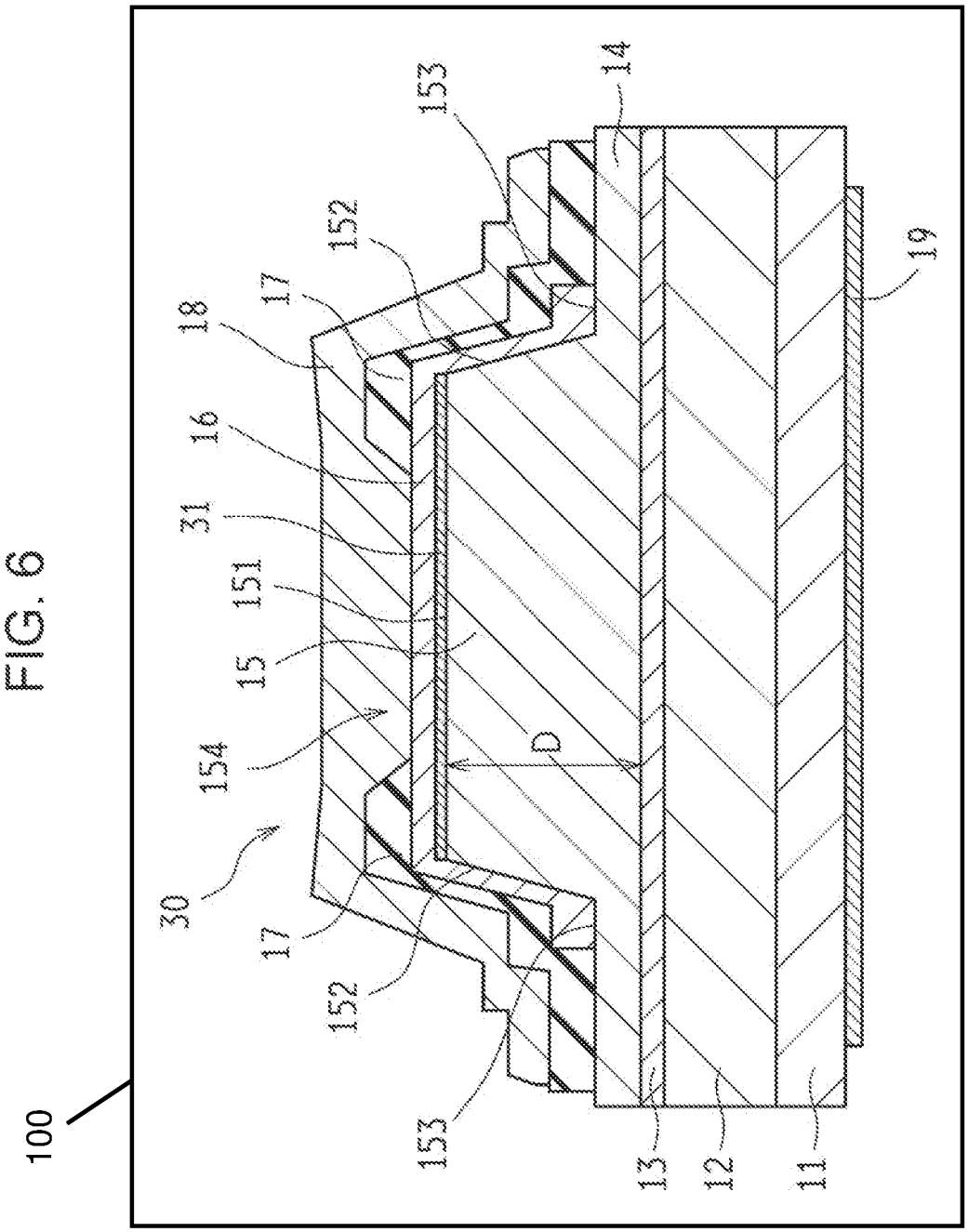
FIG. 6 is a schematic sectional view illustrating a nitride semiconductor laser device according to Embodiment 3 of the present disclosure.

FIG. 6 is a schematic sectional view illustrating a nitride semiconductor laser device 30 according to Embodiment 3. The nitride semiconductor laser device 30 according to Embodiment 3 is characterized in that a second metal layer 31 is disposed between the second-conductivity-type semiconductor layer 14 and the conductive oxide layer 16, but the other basic elements are the same as in the nitride semiconductor laser device described in Embodiment 1 or 2. For this reason, the second metal layer 31 will be described in detail, but the other elements will be denoted by the same reference signs as in Embodiment 1 or 2 and will not be described.

As illustrated in FIG. 6, in the nitride semiconductor laser device 30, the second metal layer 31 is disposed in contact with and between the second-conductivity-type semiconductor layer 14 and the conductive oxide layer 16.

The second metal layer 31 is characterized by being a film impermeable to hydrogen. Thus, the second metal layer 31 disposed between the second-conductivity-type semiconductor layer 14 and the conductive oxide layer 16 enables further prevention of entry of hydrogen atoms into the second-conductivity-type semiconductor layer 14.

The second metal layer 31 may be formed of a hydrogen-absorbing alloy of, for example, palladium, nickel, or titanium. When the second metal layer 31 is formed of such a hydrogen-absorbing alloy, in addition to hydrogen generated from the dielectric layer 17, hydrogen atoms unintentionally introduced during the process of producing the second-conductivity-type semiconductor layer 14 can be extracted by absorption.

In general, in the nitride semiconductor laser device, the second-conductivity-type semiconductor layer has high electric resistance; in order to decrease the operating voltage, the second-conductivity-type semiconductor layer may be formed with a smaller Paver thickness. However, when the distance D between the bottom surface of the second metal layer 31 and the upper surface of the light-emitting layer 13 is 400 nm or less, the laser beam is partially absorbed by the second metal layer 31, which results in deterioration in the power-light conversion efficiency. For this reason, in the nitride semiconductor laser device 30 according to this embodiment, the second metal layer 31 preferably has a layer thickness of 1.5 nm or less, more preferably 1 nm or less. This enables, without causing deterioration in the operating voltage or deterioration in the power-light conversion efficiency, improvements in the electrical characteristics.

Embodiment 4

Figure 7:
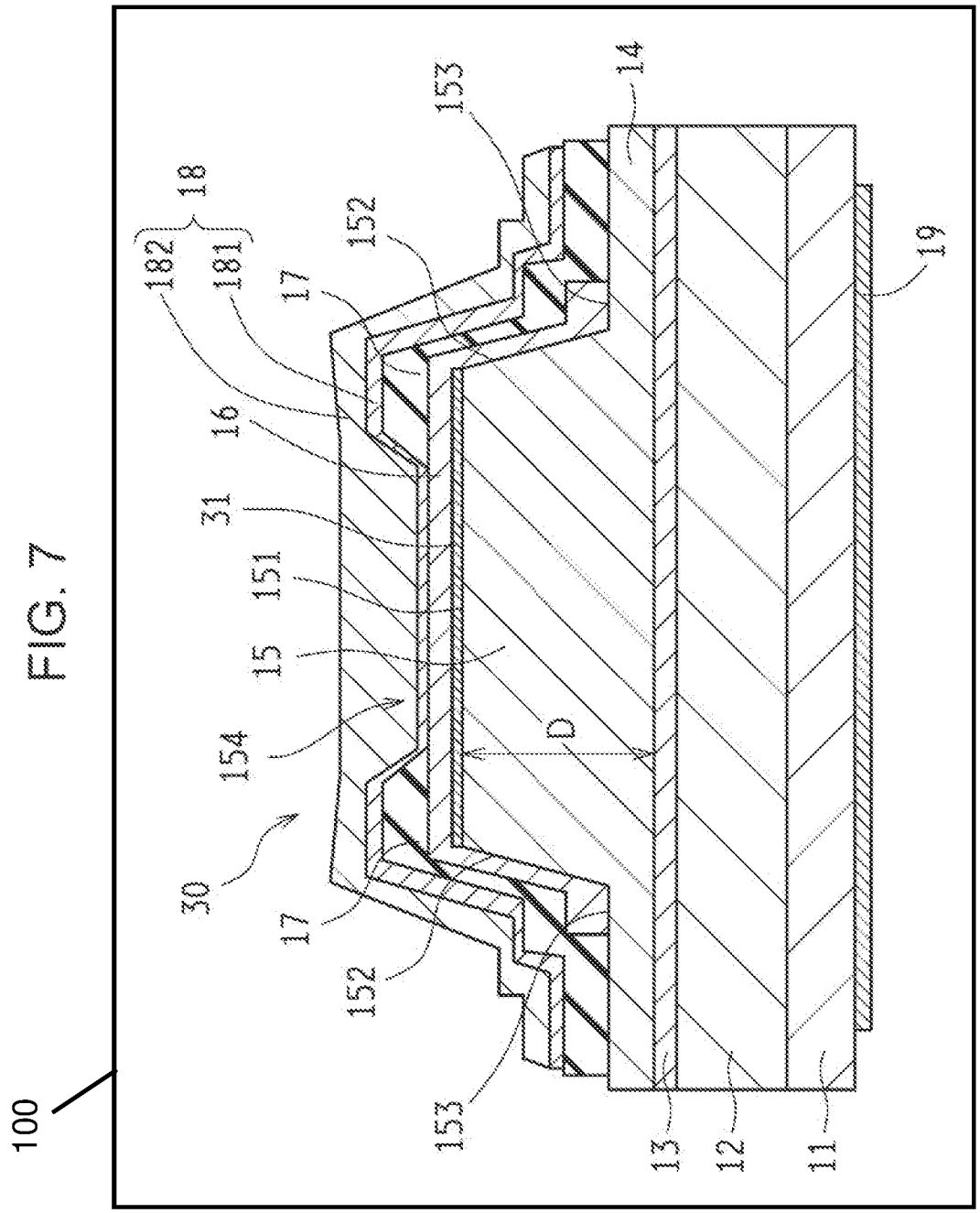
FIG. 7 is a schematic sectional view illustrating a nitride semiconductor laser device according to another embodiment of the present disclosure.
Figure 8:
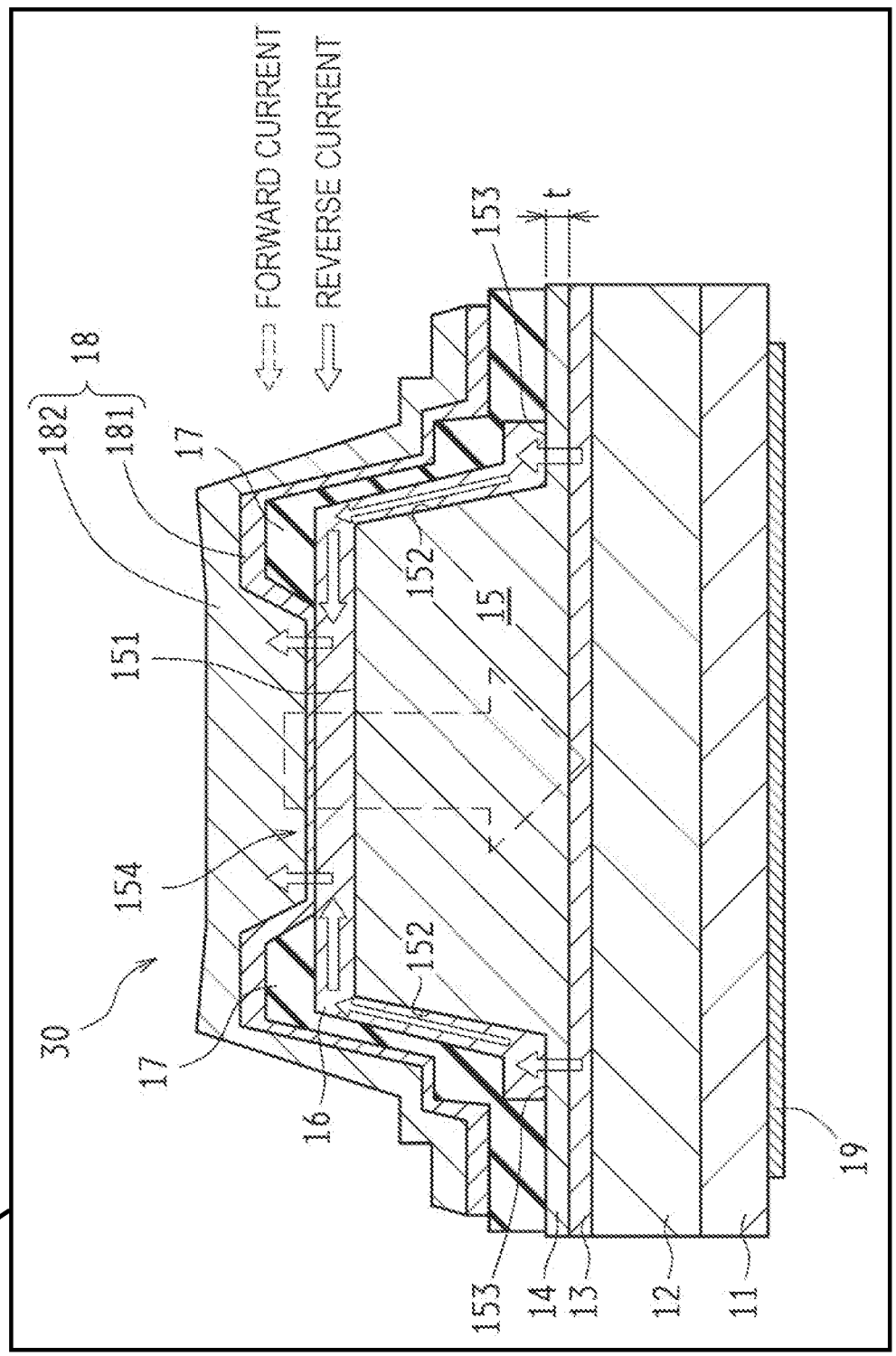
FIG. 8 is an explanatory view illustrating electrical characteristics of the nitride semiconductor laser device.

FIG. 7 and FIG. 8 are schematic sectional views of a nitride semiconductor laser device 30 according to Embodiment 4. The nitride semiconductor laser devices 10, 20, and 30 accord to the present disclosure can be practiced in, in addition to the above-described configurations described in Embodiments, other various forms. Thus, the above-described Embodiments according to the present disclosure are mere examples of the present disclosure, and do not limit the present disclosure.

For example, the first metal layer 18 disposed so as to cover the conductive oxide layer 16 and the dielectric layer 17 is not limited to the single layer configuration described above in Embodiments, and may have a configuration including a plurality of layers. As illustrated in FIG. 7, in the nitride semiconductor laser device 30, the first metal layer 18 may be constituted by a plurality of metal layers. The first metal layer 18 may have a configuration in which, for example, a titanium (Ti) layer 181 and a gold (Au) layer 182 are stacked.

The conductive oxide layer 16 is disposed so as to cover the upper surface 151 of the ridge part 15 and the opposite side surfaces 152 of the ridge part 15, and so as to protrude over at least one of the bottom surfaces 153 on the lower-end opposite sides of the ridge part 15 to cover a portion of the upper surface of the second-conductivity-type semiconductor layer 14. This provides a configuration in which the conductive oxide layer 16 and the second-conductivity-type semiconductor layer 14 are in contact with each other.

In this case, as illustrated in FIG. 8, when forward voltage is applied, forward current mainly flows from the conductive oxide layer 16 to the ridge part 15 (second-conductivity-type semiconductor layer 14). This is because the conductive oxide layer 16 has high electric resistance in the horizontal direction (lateral direction), so that current flowing through the conductive oxide layer 16 on the upper surface 151 of the ridge part 15 tends to flow in the vertical direction (upright direction) relative to the horizontal direction. Specifically, current tends not to flow from the conductive oxide layer 16 on the upper surface 151 of the ridge part 15 to the side surfaces 152 and the bottom surfaces 153 of the ridge part 15.

On the other hand, when reverse voltage is applied, the depletion layer expands, before it reaches the conductive oxide layer 16 on the upper surface 151 of the ridge part 15, to the conductive oxide layer 16 on the bottom surfaces 153 of the ridge part 15, and leakage occurs along small arrows in FIG. 8 (punch-through). As a result, device breakdown can be suppressed.

In order to provide such characteristics, the second-conductivity-type semiconductor layer 14 may have a Mg concentration of, for example, $5 \times 10^{16}$ cm$^{-3}$ or more and $1 \times 10^{19}$ cm$^{-3}$ or less. On the bottom surfaces 153 of the ridge part 15, the second-conductivity-type semiconductor layer 14 may have a thickness t of, for example, 10 nm or more and 300 nm or less.

Figure 9:
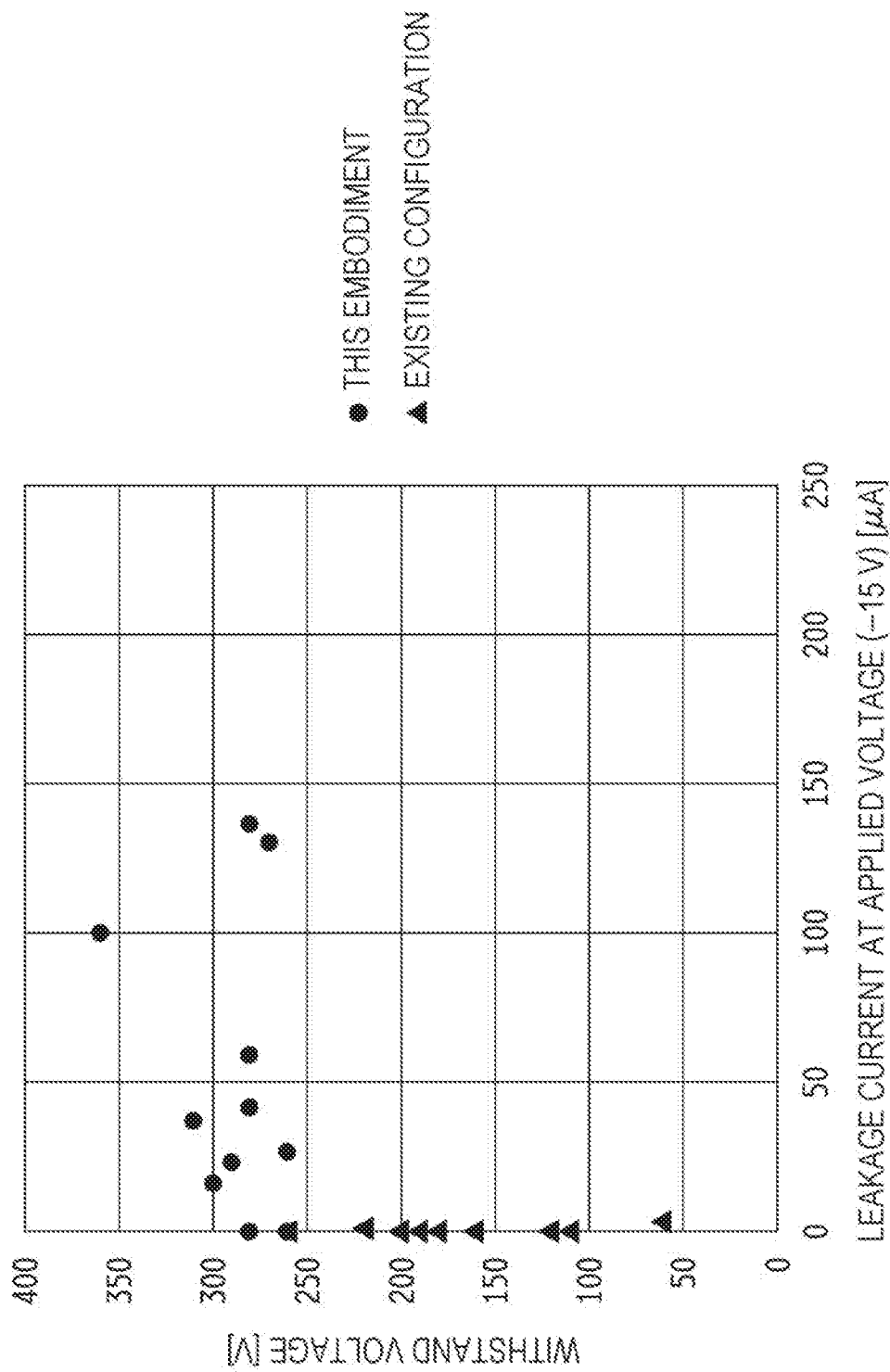
FIG. 9 is a graph illustrating results of evaluation of leakage current in the nitride semiconductor laser device and withstand voltage for the leakage current.

FIG. 9 is a graph illustrating result of evaluation of leakage current occurring upon application of a reverse voltage of 15 V, and withstand voltage (withstanding voltage) of the laser device during occurrence of the leakage current. The withstand voltage is the voltage limit under which the nitride semiconductor laser device does not malfunction or is not broken down. On the basis of this, the nitride semiconductor laser device 30 according to this Embodiment was evaluated for electro static discharge (ESD) resistance. As a result, the withstand voltage was found to be high, compared with semiconductor laser devices having an existing configuration in which a conductive electrode is disposed only on the upper surface of the ridge part (refer to FIG. 11). It has also been found out that, in the nitride semiconductor laser devices 30 according to this Embodiment, most of devices having high ESD resistance cause, upon application of a reverse voltage of 15 V, occurrence of a leakage current of 10 μA or more. This fact agrees with the above-described mechanism of suppressing device breakdown at the reverse withstand voltage. In general, the ESD test is a destructive inspection and hence cannot be used to test all the products. By contrast, when devices according to the present disclosure under application of a reverse voltage of 15 V are found to cause occurrence of a leakage current of 10 μA or more, these devices can be selected as having ESD resistance.

Furthermore, in the nitride semiconductor laser device 30 according to this Embodiment, the conductive oxide layer 16 is continuously disposed so as to cover the upper surface 151 of the ridge part 15, the opposite side surfaces 152 of the ridge part 15, and the bottom surface 153 of the ridge part 15; thus, the nitride semiconductor laser device 30 has high ESD resistance, and causes occurrence of weak current leakage upon application of reverse voltage. Thus, the nitride semiconductor laser device 30 enables suppression of device breakdown upon application of reverse voltage, and uses the conductive oxide layer 16 as a device protective circuit.

A semiconductor laser apparatus according to the present disclosure may include the nitride semiconductor laser device 10, 20, or 30 described in the above-described Embodiments, a submount having a mount surface on which the nitride semiconductor laser device is mounted, and a package 100 hermetically sealing the nitride semiconductor laser device 10, 20, or 30 and the submount.

Existing semiconductor laser devices do not sufficiently resist the back electromotive force and hence undergo device breakdown due to, for example, static electricity, which has been problematic. For this reason, in order to suppress device breakdown, such an existing semiconductor laser device needs to be mounted, within a single package, together with a protective device such as a Zener diode. By contrast, as described above, the nitride semiconductor laser device 30 according to this Embodiment has a function of a device protective circuit, so that the necessity of using the protective device such as a Zener diode has been eliminated, and a semiconductor laser apparatus including the nitride semiconductor laser device 30 does not need such a protective device mounted within the same package.

As has been described so far, the nitride semiconductor laser devices 10, 20, and 30 according to the present disclosure achieve improvements in the electrical characteristics relative to existing ones, to provide improved reliability.

Example 1

Figure 10:
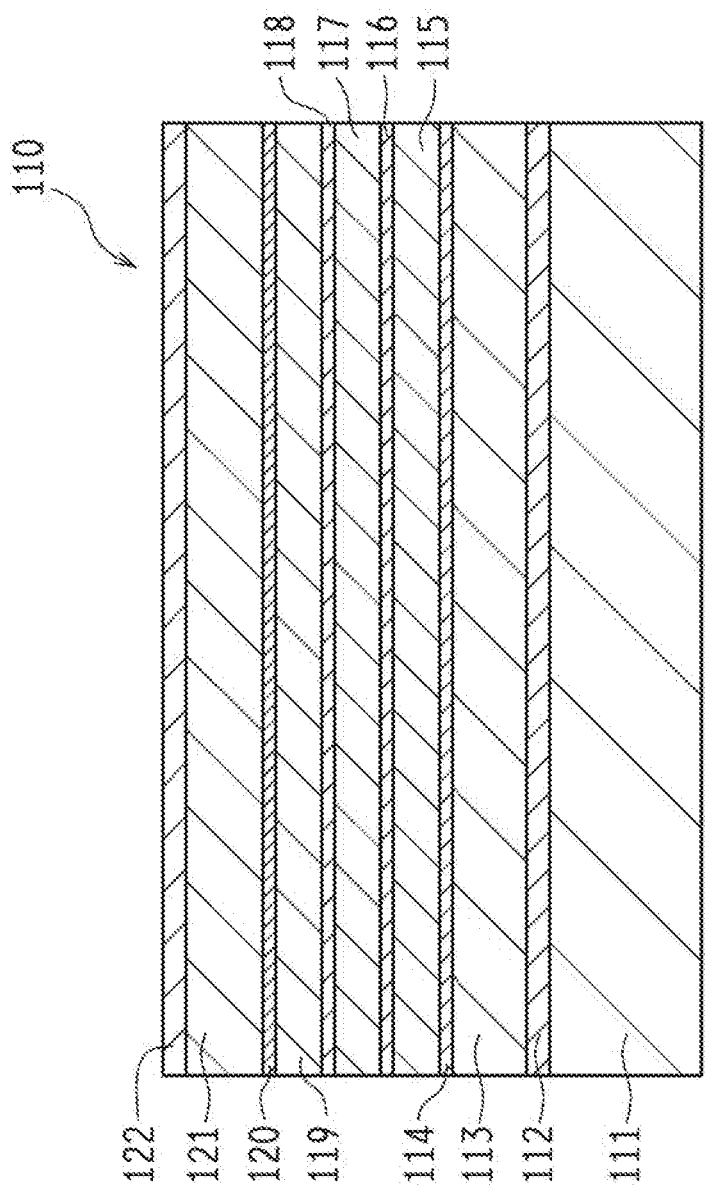
FIG. 10 is a schematic sectional view of a wafer of a nitride semiconductor laser device according to an Example of the present disclosure.

FIG. 10 is a schematic sectional view of a wafer 110 in a nitride semiconductor laser device according to an Example of the present disclosure.

The wafer 110 has a configuration in which, on the (0001) plane of an n-type GaN substrate 111, an n-type GaN layer 112, an n-type AlGaN cladding layer 113, an n-type GaN layer 114, a first non-doped InGaN optical guide layer 115, a first non-doped GaN layer 116, a light-emitting layer 117, a second non-doped GaN layer 118, a second non-doped InGaN optical guide layer 119, a p-type AlGaN layer 120, a p-type AlGaN cladding layer 121, and a p-type GaN contact layer 122 are sequentially stacked.

The n-type GaN layer 112, the n-type AlGaN cladding layer 113, and the n-type GaN layer 114 correspond to the first-conductivity-type semiconductor layer 12. The p-type AlGaN layer 120, the p-type AlGaN cladding layer 121, and the p-type GaN contact layer 122 correspond to the second-conductivity-type semiconductor layer 14.

In this Example, the nitride semiconductor laser device was produced in the following manner.

Within an MOCVD apparatus, the n-type GaN substrate 111 is first heated to 1050° C. Subsequently, while the n-type GaN substrate 111 is held at the temperature, a group III element source trimethylagallium (TMG), ammonia gas, and a doping gas SiH$_4$ are introduced, to form, on the n-type GaN substrate 111, the n-type GaN layer 112 having a thickness of 0.5 μm.

The n-type GaN layer 112 is formed in order to improve the surface morphology of the polished n-type GaN substrate 111, and is formed in order to relax the residual stress strain in the surface of the n-type GaN substrate 111, to obtain the surface of the n-type GaN substrate 111 suitable for epitaxial growth.

Subsequently, into the MOCVD apparatus, a group III element source trimethylaluminum (TMA) is further added, to form the n-type AlGaN cladding layer 113 having a thickness of 1.2 μm and a Si impurity concentration of $1 \times 10^{18}$ atoms/cm$^3$. The n-type AlGaN cladding layer 113 was formed with an Al content ratio of 7%.

Subsequently, the introduction of TMA into the MOCVD apparatus is stopped, to form the n-type GaN layer 114 having a thickness of 0.2 µm. The n-type GaN layer 114 was formed with a Si impurity concentration of $1\times10^{18}$ atoms/cm$^3$.

Subsequently, the temperature of the n-type GaN substrate 111 is lowered to 800° C. Into the MOCVD apparatus, trimethylindium (TMI) is added and the introduction of SiH$_4$ is stopped, to form the first undoped In$_{0.04}$Ga$_{0.96}$N optical guide layer 115 having a thickness of 100 nm.

On the first, undoped In$_{0.04}$Ga$_{0.96}$N optical guide layer 115, the first GaN layer 116 having a thickness of 3 nm is formed. Subsequently, on the first GaN layer 116, an undoped In$_{0.16}$Ga$_{0.84}$N well layer having a thickness of 3 nm, an undoped GaN barrier layer having a thickness of 5 nm, and an undoped In$_{0.16}$Ga$_{0.84}$N well layer having a thickness of 3 nm are sequentially stacked to form the light-emitting layer 117. Furthermore, on the light-emitting layer 117, the second GaN layer 118 having a thickness of 3 nm and the second non-doped In$_{0.04}$Ga$_{0.96}$N optical guide layer 119 having a thickness of 100 nm are sequentially formed.

Subsequently, the temperature of the n-type GaN substrate 111 is again raised to 1050° C., and Cp$_2$Mg source gas) is fed, to form sequentially the p-type Al$_{0.20}$Ga$_{0.80}$N layer 120 having a thickness of 10 nm and having a Mg concentration of $4\times10^{18}$ cm$^{-3}$, the p-type Al$_{0.04}$Ga$_{0.96}$N cladding layer 121 having a thickness of 0.3 µm and having a Mg concentration of $3\times10^{18}$ cm$^{-8}$, and the p-type GaN contact layer 122 having a thickness of 10 nm and having a Mg concentration of $1\times10^{19}$ cm$^{-3}$. This provides the wafer 110.

Incidentally, in the case of using, as the conductive oxide layer 16, indium tin oxide (ITO), the p-type GaN contact layer 122 may be replaced by a p-type InGaN contact layer. This is because InGaN provides a lower contact resistance than GaN.

Subsequently, a mask layer having a predetermined pattern is formed on the wafer 110, and a strip ridge part is formed. On the surface of the p-type GaN contact layer 122, a CVD apparatus is used to form, as the first mask layer, a SiO$_2$ film with a film thickness of 300 nm. Subsequently, photoresist is applied, and an RIE (reactive ion etching) apparatus is used to form, in the first mask layer, a strip pattern having a width of 15 µm.

Subsequently, the surface of the p-type GaN contact layer 122 exposed through the opening of the first mask layer is etched with the RIE apparatus until a portion of the p-type Al$_{0.04}$Ga$_{0.96}$N cladding layer 121 is exposed. The first mask layer is removed by wet etching, to form a strip ridge part in which the upper surface of the ridge part has a width of 15 µm and the height between the upper surface of the ridge part and the bottom surface of the ridge is 190 nm.

Subsequently, a sputtering apparatus is used to form a film of a conductive oxide ITO to 200 nm so as to cover the ridge part. An ordinary photolithography technique is used to form a photoresist mask protruding, by about 1 µm, from opposite sides of the ridge part, and having a width of 17 µm. Subsequently, ITO exposed through the opening of the photoresist mask is etched by wet etching, to form ITO disposed on the upper surface and opposite side surfaces of the ridge part and protruding, by 1 µm, over the bottom surfaces on opposite sides of the ridge part. Subsequently, the photoresist mask is removed.

When the second metal layer formed of palladium is disposed between the p-type GaN contact layer 122 and ITO on the upper surface of the ridge part, it may be formed, prior to formation of the ITO film, on the upper surface of the ridge part by using a photolithography technique and a vapor deposition apparatus.

Subsequently, a CVD apparatus is used to form a dielectric layer formed of SiO$_2$ to 200 nm so as to cover the ITO. Subsequently, a photolithography technique is used to form an opening by etching a portion of SiO$_2$ formed on the upper surface of the ridge part. Subsequently, a metal vapor deposition apparatus is used to perform vapor deposition of, as the first metal layer, titanium to 15 nm so as to cover the ITO exposed through the opening and the dielectric layer formed of SiO$_2$. After the first metal layer is formed, the wafer is temporarily taken out of the vapor deposition apparatus, and subjected to heat treatment at a temperature of several hundred degrees Celsius. This heat treatment causes a decrease in the contact resistance between layers of the second-conductivity-type semiconductor layer, the conductive oxide layer (for example, ITO), and the first metal layer, which contributes to a decrease in the voltage.

After the heat treatment, the metal vapor deposition apparatus is used again to achieve vapor deposition of gold to a thickness of 800 nm on titanium forming the first metal layer.

Subsequently, the back surface of the n-type GaN substrate 111 was subjected to grinding and polishing treatment such that the thickness is reduced to about 90 nm. On one back surface of the n-type GaN substrate 111, as the first electrode, vapor deposition of titanium and gold is performed respectively to 15 nm and 400 nm.

In addition, the ridge part is cleaved such that the long side of the strip has a length of 1200 µm. On the opposite edge surfaces of the ridge part provided by the cleaving, protective films are formed. Division into chips is performed such that the chip width is 200 µm. In this way, nitride semiconductor laser devices were obtained.

Example 2

This Example has the same features as those disclosed in Embodiments 1 to 3 or Example 1 except that the layer thicknesses of the conductive oxide layer 16 according to Embodiment 2 were set as follows: T1=200 nm, T2=80 nm, and T3=150 nm.

Example 3

This Example has the same features as those disclosed in Embodiments 1 to 3 or Example 1 except that the layer thicknesses of the conductive oxide layer 16 according to Embodiment 2 were set as follows: T1=250 nm, T2=105 nm, and T3=100 nm.

Example 4

This Example has the same features as those disclosed in Embodiments 1 to 3 or Example 1 except that the layer thicknesses of the conductive oxide layer 16 according to Embodiment 2 were set as follows: T1=150 nm, T2=60 nm, and T3=60 nm.

Example 5

This Example has the same features as those disclosed in Embodiments 1 to 3 or Example 1 except that the width W1 of the conductive oxide layer 16 and the width W2 of the upper surface of the ridge part 15 according to Embodiment 2 were respectively set to 3 µm and 35 µm.

Example 6

This Example has the same features as those disclosed in Embodiments 1 to 3 or Example 1 except that the width W1 of the conductive oxide layer 16 and the width W2 of the upper surface of the ridge part 15 according to Embodiment 2 were respectively set to 9 µm and 45 µm.

The nitride semiconductor laser devices according to Examples of the present disclosure produced above are operated at low voltage and have a low level of device defectiveness due to abnormal voltage, hence have high reliability, compared with existing semiconductor laser devices containing conductive oxide in which the dielectric layer is formed on all the side surfaces of the ridge part.

Incidentally, the present disclosure is not limited to the above-described configurations. The configurations can be changed in various ways within the scope indicated with Claims. Embodiments obtained by appropriately combining technical means disclosed in different embodiments also fall into the technical scope of the present disclosure. Furthermore, technical means disclosed in Embodiments may be combined to form novel technical features.

The present disclosure contains subject matter related to that disclosed in U.S. Provisional Application No. 62/798,392 filed on Jan. 29, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nitride semiconductor laser device comprising:
   a substrate;
   a first-conductivity-type semiconductor layer formed on the substrate;
   a light-emitting layer disposed on the first-conductivity-type semiconductor layer;
   a second-conductivity-type semiconductor layer disposed on the light-emitting layer;
   a strip ridge part disposed in the second-conductivity-type semiconductor layer;
   a conductive oxide layer disposed so as to cover an upper surface of the ridge part and portions of opposite side surfaces of the ridge part;
   a dielectric layer disposed so as to cover a portion of the conductive oxide layer laying on the upper surface of the ridge part, and
   a first metal layer disposed so as to cover the conductive oxide layer and the dielectric layer, wherein a portion of the conductive oxide layer disposed on the upper surface of the ridge part has an exposed portion exposed through the dielectric layer, and the exposed portion is covered with the first metal layer, and
   wherein the conductive oxide layer is disposed so as to cover the upper surface of the ridge part, the opposite side surfaces of the ridge part, and a portion of an upper surface of the second-conductivity-type semiconductor layer disposed on at least one of lower-end opposite sides of the ridge part.

2. A nitride semiconductor laser device comprising:
   a substrate;
   a first-conductivity-type semiconductor layer formed on the substrate;
   a light-emitting layer disposed on the first-conductivity-type semiconductor layer;
   a second-conductivity-type semiconductor layer disposed on the light-emitting layer;
   a strip ridge part disposed in the second-conductivity-type semiconductor layer;
   a conductive oxide layer disposed so as to cover an upper surface of the ridge part and portions of opposite side surfaces of the ridge part;
   a dielectric layer disposed so as to cover a portion of the conductive oxide layer laying on the upper surface of the ridge part, and
   a first metal layer disposed so as to cover the conductive oxide layer and the dielectric layer,
   wherein a portion of the conductive oxide layer disposed on the upper surface of the ridge part has an exposed portion exposed through the dielectric layer, and the exposed portion is covered with the first metal layer, and
   wherein the conductive oxide layer is disposed so as to cover the upper surface of the ridge part, the opposite side surfaces of the ridge part, and portions of upper surfaces of the second-conductivity-type semiconductor layer positioned on lower-end opposite sides of the ridge part.

3. The nitride semiconductor laser device according to claim 2,
   wherein portions of the conductive oxide layer that are disposed so as to cover the portions of the upper surfaces of the second-conductivity-type semiconductor layer positioned on the lower-end opposite sides of the ridge part have a width of 1.5 µm or less.

4. The nitride semiconductor laser device according to claim 2,
   wherein the conductive oxide layer
   has a refractive index higher than a refractive index of the dielectric layer, and
   includes portions that are disposed so as to cover the portions of the upper surfaces of the second-conductivity-type semiconductor layer positioned on the lower-end opposite sides of the ridge part, and that have a width that is ⅕ or less of a width of the upper surface of the ridge part.

5. The nitride semiconductor laser device according to claim 2,
   wherein the conductive oxide layer satisfies a relation of T1>T2 or T1>T3,
   where T1 represents a layer thickness of the portion disposed on the upper surface of the ridge part,
   T2 represents a layer thickness of portions disposed on the side surfaces of the ridge part, and
   T3 represents a layer thickness of portions disposed so as to cover the portions of the upper surfaces of the second-conductivity-type semiconductor layer positioned on the lower-end opposite sides of the ridge part.

6. A nitride semiconductor laser device comprising:
   a substrate;
   a first-conductivity-type semiconductor layer formed on the substrate;
   a light-emitting layer disposed on the first-conductivity-type semiconductor layer;
   a second-conductivity-type semiconductor layer disposed on the light-emitting layer;
   a strip ridge part disposed in the second-conductivity-type semiconductor layer;

a conductive oxide layer disposed so as to cover an upper surface of the ridge part and portions of opposite side surfaces of the ridge part;

a dielectric layer disposed so as to cover a portion of the conductive oxide layer; and a first metal layer disposed so as to cover the conductive oxide layer and the dielectric layer, wherein a portion of the conductive oxide layer disposed on the upper surface of the ridge part has an exposed portion exposed through the dielectric layer, and the exposed portion is covered with the first metal layer, and wherein the nitride semiconductor laser device further comprises a second metal layer disposed between and in contact with the second-conductivity-type semiconductor layer and the conductive oxide layer.

7. The nitride semiconductor laser device according to claim 6, wherein the second metal layer contains palladium, nickel, or titanium.

8. The nitride semiconductor laser device according to claim 6, wherein the second metal layer has a layer thickness of 1 nm or less.

9. A semiconductor laser apparatus comprising:

a nitride semiconductor laser device; and a package sealing the nitride semiconductor laser device, the nitride semiconductor laser device comprising:

a substrate;

a first-conductivity-type semiconductor layer formed on the substrate;

a light-emitting layer disposed on the first-conductivity-type semiconductor layer;

a second-conductivity-type semiconductor layer disposed on the light-emitting layer;

a strip ridge part disposed in the second-conductivity-type semiconductor layer;

a conductive oxide layer disposed so as to cover an upper surface of the ridge part and portions of opposite side surfaces of the ridge part;

a dielectric layer disposed so as to cover a portion of the conductive oxide layer; and a first metal layer disposed so as to cover the conductive oxide layer and the dielectric layer, wherein a portion of the conductive oxide layer disposed on the upper surface of the ridge part has an exposed portion exposed through the dielectric layer, and the exposed portion is covered with the first metal layer, wherein, when a voltage of −15 V is applied to the nitride semiconductor laser device, a leakage current of 10 μA or more occurs.

10. The semiconductor laser apparatus according to claim 9, wherein no protective devices are mounted within the package.

* * * * *